United States Patent
Robertson et al.

(10) Patent No.: US 12,338,549 B1
(45) Date of Patent: Jun. 24, 2025

(54) METHOD AND SYSTEM FOR LIQUID ENCAPSULATED GROWTH OF CADMIUM ZINC TELLURIDE CRYSTALS

(71) Applicant: DRS Network & Imaging Systems, LLC, Melbourne, FL (US)

(72) Inventors: Lance Robertson, Rockwall, TX (US); Luigi Colombo, Dallas, TX (US); Victor Perez-Rubio, Plano, TX (US); Tim Svoboda, Grand Prairie, TX (US); Fred Raymel Harris, Duncanville, TX (US); Kathryn O'Brien, Dallas, TX (US)

(73) Assignee: DRS Network & Imaging Systems, LLC, Melbourne, FL (US)

( * ) Notice: Subject to any disclaimer, the term of this patent is extended or adjusted under 35 U.S.C. 154(b) by 0 days.

(21) Appl. No.: 18/214,981

(22) Filed: Jun. 27, 2023

Related U.S. Application Data

(62) Division of application No. 16/905,646, filed on Jun. 18, 2020, now Pat. No. 11,866,848.

(Continued)

(51) Int. Cl.
*C30B 35/00* (2006.01)
*C30B 9/06* (2006.01)
(Continued)

(52) U.S. Cl.
CPC .............. *C30B 9/06* (2013.01); *C30B 11/00* (2013.01); *C30B 15/007* (2013.01); *C30B 27/02* (2013.01);
(Continued)

(58) Field of Classification Search
CPC ....... C30B 11/00; C30B 15/00; C30B 15/007; C30B 27/02; C30B 29/46; C30B 29/48; C30B 9/06; C30B 35/00
See application file for complete search history.

(56) References Cited

U.S. PATENT DOCUMENTS 4,874,458 A * 10/1989 Nishizawa ............ C30B 15/305
117/34
4,944,834 A * 7/1990 Tada ....................... C30B 15/14
117/900

(Continued)

FOREIGN PATENT DOCUMENTS

EP 1013801 6/2000
EP 1574602 4/2010

(Continued)

OTHER PUBLICATIONS

European Patent Office, English computer translation of JP-04349193 (Year: 2024).*

(Continued)

*Primary Examiner* — Matthew J Song
(74) *Attorney, Agent, or Firm* — Kilpatrick Townsend & Stockton LLP

(57) ABSTRACT

A system for growing a CdZnTe crystal includes a crucible operable to contain a solid CdZnTe source and a heating element operable to melt an upper surface to the solid CdZnTe source and form a tellurium rich melt floating on the solid CdZnTe source. The crucible is operable to contain an encapsulating layer above the tellurium rich melt. The system also includes a rod operable to mechanically support a CdZnTe seed crystal.

18 Claims, 12 Drawing Sheets

Related U.S. Application Data

(60) Provisional application No. 62/864,918, filed on Jun. 21, 2019.

(51) Int. Cl.
   *C30B 11/00* (2006.01)
   *C30B 15/00* (2006.01)
   *C30B 27/02* (2006.01)
   *C30B 29/46* (2006.01)
   *C30B 29/48* (2006.01)

(52) U.S. Cl.
   CPC .............. *C30B 29/46* (2013.01); *C30B 29/48* (2013.01); *C30B 35/00* (2013.01)

(56) References Cited

U.S. PATENT DOCUMENTS

| | | | | |
|---|---|---|---|---|
| 5,916,364 | A * | 6/1999 | Izumi ...................... | C30B 15/36 117/44 |
| 6,171,392 | B1 * | 1/2001 | Iino ........................ | C30B 15/00 117/20 |
| 6,183,556 | B1 * | 2/2001 | Aydelott ................. | C30B 15/32 117/911 |
| 2002/0148402 | A1 * | 10/2002 | Kou ........................ | C30B 29/40 117/13 |
| 2005/0000403 | A1 * | 1/2005 | Asahi ..................... | C30B 27/02 117/13 |
| 2012/0056135 | A1 * | 3/2012 | DeLuca .................. | C30B 29/06 206/524.1 |
| 2013/0032083 | A1 * | 2/2013 | Kitagawa ................ | C30B 29/06 117/14 |
| 2013/0233237 | A1 * | 9/2013 | Bender .................. | C30B 15/002 117/31 |
| 2014/0144371 | A1 * | 5/2014 | Swaminathan ......... | C30B 15/14 117/213 |
| 2014/0174337 | A1 * | 6/2014 | Swaminathan ....... | C30B 15/002 117/14 |
| 2019/0136406 | A1 * | 5/2019 | Haringer ................ | C30B 29/06 |

FOREIGN PATENT DOCUMENTS

| | | | | |
|---|---|---|---|---|
| JP | 04349193 | A * | 12/1992 | ............ C30B 15/14 |
| JP | 08151290 | | 6/1996 | |
| RU | 2563485 | C1 * | 9/2015 | ............ C30B 15/00 |

OTHER PUBLICATIONS

English computer translation of RU-2563485-C1 (Year: 2024).*
"English Translation of JP 08-151290", 2022, 43 pages.
U.S. Appl. No. 16/905,646 , "Non-Final Office Action", Dec. 8, 2022, 10 pages.
U.S. Appl. No. 16/905,646 , "Notice of Allowance", Mar. 29, 2023, 8 pages.
Asahi et al., "ZnTe Single Crystal Growth", Physica Status Solidi, No. 241, No. 3, 2004, pp. 648-651.
Roy et al., "Growth of CdZnTe Crystals by the Traveling Heater Method", Journal of Crystal Growth, vol. 37, Sep. 15, 2013, pp. 57-62.

* cited by examiner

METHOD AND SYSTEM FOR LIQUID ENCAPSULATED GROWTH OF CADMIUM ZINC TELLURIDE CRYSTALS

CROSS-REFERENCES TO RELATED APPLICATIONS

This application is a divisional of U.S. patent application Ser. No. 16/905,646 filed on Jun. 18, 2020, which claims priority to Provisional Patent Application 62/864,918, filed Jun. 21, 2019, the contents of which are hereby incorporated by reference in their entirety.

BACKGROUND OF THE INVENTION

Cadmium zinc telluride (CdZnTe), which can also be referred to as CZT, is a direct bandgap semiconductor that is used in a variety of opto-electronic applications, including infrared detectors, electro-optic modulators, and solar cells. The growth of CdZnTe crystals has been performed using several techniques including the Vertical Bridgman method, the Horizontal Bridgman method, and the Traveling Heater method.

Despite the progress made in techniques for the growth of CdZnTe crystals, there is a need in the art for improved methods and systems related to the growth of lower cost, large area, high quality single crystal CdZnTe crystals for various applications including substrates for HgCdTe infrared detectors, and radiation detectors.

SUMMARY OF THE INVENTION

The present disclosure relates in general to the growth of semiconductor crystals. More particularly, embodiments of the present invention provide methods and systems for growing CdZnTe crystals using a solid CdZnTe source and a Te-rich Cd—Zn—Te melt floating on the solid CdZnTe source that is translated into the solid CdZnTe source as the CdZnTe crystal grows above the melt. Accordingly, some embodiments of the present invention can be referred to as liquid encapsulated growth of oriented single crystals of CdZnTe. The invention has wider applicability and is also applicable to other crystal growth systems.

According to an embodiment of the present invention, a method of growing a cadmium zinc telluride (CdZnTe) crystal is provided. The method includes providing a crucible including a solid CdZnTe source and forming a Te-rich Cd—Zn—Te melt on the solid CdZnTe source. The method also includes positioning a CdZnTe seed crystal in physical contact with the Te-rich Cd—Zn—Te melt and growing the CdZnTe crystal from the tellurium rich melt. In an embodiment, the method further includes positioning an encapsulating layer on the Te-rich Cd—Zn—Te melt. The encapsulating layer can include boron oxide. Furthermore, the method can include, after growing the CdZnTe crystal, raising the CdZnTe crystal into the encapsulating layer and cooling the CdZnTe crystal to a temperature greater than the solidification temperature of the encapsulating layer.

In another embodiment, the method also includes, after growing the CdZnTe crystal, supporting the CdZnTe crystal using a lift mechanism and lifting the CdZnTe crystal into the encapsulating layer. The CdZnTe seed crystal can be rotated while growing the CdZnTe crystal. The method can further include injecting zinc into the Te-rich Cd—Zn—Te melt to modify a stoichiometry of the Te-rich Cd—Zn—Te melt, injecting cadmium or tellurium into the Te-rich Cd—Zn—Te melt, and/or injecting indium into the Te-rich Cd—Zn—Te melt to modify doping levels of the tellurium rich Cd—Zn—Te melt. In a particular embodiment, the Te-rich Cd—Zn—Te melt comprises a growth surface opposing the solid CdZnTe source and positioning the CdZnTe seed crystal in physical contact with the Te-rich Cd—Zn—Te melt comprises positioning a growth surface of the CdZnTe seed crystal on the growth surface of the Te-rich Cd—Zn—Te melt.

According to another embodiment of the present invention, a method of cooling a CdZnTe crystal is provided. The method includes growing a CdZnTe crystal from a Te-rich Cd—Zn—Te melt at least partially encapsulated by an encapsulating layer and lifting the CdZnTe crystal into the encapsulating layer. The method also includes cooling the CdZnTe crystal to a temperature greater than the solidification temperature of the encapsulating layer.

According to a particular embodiment of the present invention, a system for growing a CdZnTe crystal is provided. The system includes a crucible operable to contain a solid CdZnTe source and a heating element operable to melt an upper surface to the solid CdZnTe source and form a tellurium rich melt floating on the solid CdZnTe source. The crucible is operable to contain an encapsulating layer above the tellurium rich melt. The system also includes a rod operable to mechanically support a CdZnTe seed crystal.

Numerous benefits are achieved by way of these apparatuses over conventional apparatuses. For example, some embodiments provide methods and systems suitable for the growth of oriented unconfined CdZnTe single crystals. Moreover, defects (e.g., dislocations, grain boundaries, subgrain boundaries, inclusions and precipitates) as well as the compositional uniformity of zinc in the CdZnTe crystal are improved over conventional techniques. In some embodiments, the use of a Te-rich Cd—Zn—Te melt provides lower growth temperature and lower cadmium vapor pressure than conventional techniques. As described herein, the use of a CdZnTe seed crystal provides a controlled crystal orientation for the as-grown CdZnTe crystal. Embodiments of the present invention utilize an unconstrained growth geometry, which reduces stress in the as-grown CdZnTe crystal and reduces or prevents the introduction of defects associated with the crucible walls.

Moreover, by utilizing a solid CdZnTe source as the source for the crystal growth process, embodiments of the present invention provide improved compositional control as well as improved compositional uniformity. In some embodiments, liquid encapsulation, for example, using boron oxide, is utilized to reduce evaporation of cadmium and tellurium from the Te-rich Cd—Zn—Te melt, thereby improving compositional control as described more fully herein. Additionally, by utilizing a thin melt region (e.g., on the order of a millimeter to centimeters in thickness), convective currents in the melt region, also referred to as a melt layer, are reduced, thereby reducing defects and enabling higher growth rates compared to conventional methods. These and other details of embodiments along with many of their advantages and features are described in the following description, claims, and figures.

DETAILED DESCRIPTION OF SPECIFIC EMBODIMENTS

Figure 1A:
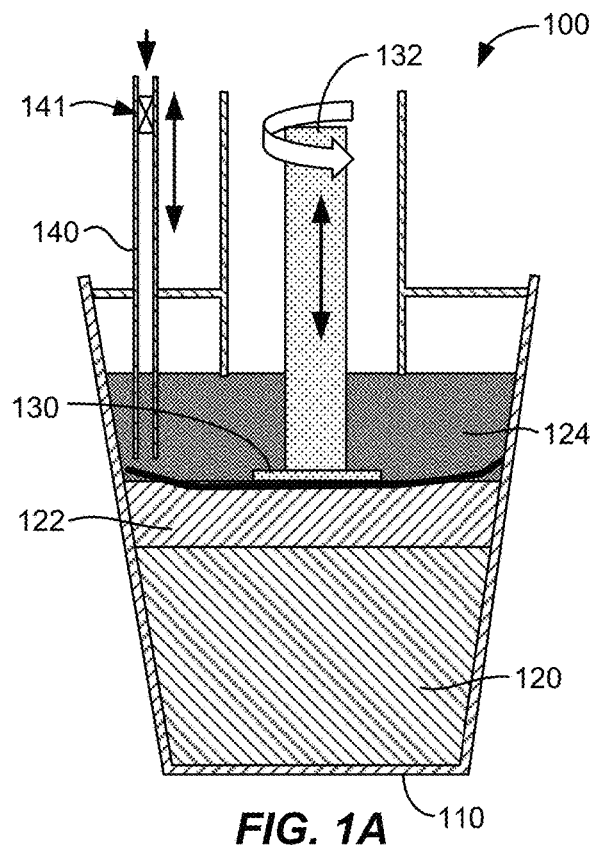
FIG. 1A is a simplified schematic diagram illustrating a CdZnTe crystal growth system at a first stage of crystal growth according to an embodiment of the present invention.

Embodiments of the present invention provide systems and methods related to the growth of CdZnTe crystals. In particular, embodiments of the present invention relate to methods and systems suitable for the growth of large area, oriented single crystal CdZnTe with a low level of defects. The diameter of the CdZnTe crystals is controlled during growth to achieve desired crystal diameters, for example, substrates having diameters of 75 mm, 100 mm, 150 mm, 200 mm, or larger depending upon the overall growth system size/melt size. Alternatively, substrates with various geometries, such as circular, square or rectangular geometries (e.g., 5 cm×5 cm; 6 cm×6 cm; 9 cm×9 cm; or the like), are also included within the scope of the present invention. One of ordinary skill in the art would recognize many variations, modifications, and alternatives.

The inventors have determined that there are various shortcomings associated with conventional crystal growth techniques, including the Vertical Bridgman (VB) method, the Horizontal Bridgman (HB) method, and the Traveling Heater method (THM). For example, the VB and the HB methods do not produce intentionally oriented single crystals. As a result, mining of the crystals, rather than slicing crystals from a boule, leads to high material cost. Although the THM is able to produce oriented crystals in some implementations, slow growth rates, crucible wall effects and inability to observe the growth interface can result in high cost and lower quality. Moreover, the THM can be hampered by a limited ability to control the temperature profile of the melt which can lead to voiding.

Embodiments of the present invention provide for composition control during the single crystal growth of CdZnTe crystals, which is desirable during the growth binary and ternary systems, particularly those having high vapor pressure elements. Moreover, since CdZnTe and other II-VI compounds are generally characterized by poor mechanical properties, and thus can be easily damaged during growth by thermal stresses (typically evidenced by high dislocation densities), embodiments of the present invention actively control the temperature profiles during growth.

As described herein, the CdZnTe crystal growth system described herein provides a number of benefits not available using conventional techniques. As an example, the Te-rich Cd—Zn—Te melt described herein enables a reusable melt, reducing the environmental impact and the production costs. The Te-rich Cd—Zn—Te melt described herein is characterized by impurity segregation that is low, i.e., the impurities tend to remain in the Te-rich Cd—Zn—Te melt rather than being incorporated into the CdZnTe crystal. For typical CdZnTe crystal growth using embodiments of the present invention (e.g., a thickness of the Te-rich Cd—Zn—Te melt on the order of two centimeters, a CdZnTe source of 20 centimeters in length and 15 centimeters in diameter), the loaded CdZnTe solid and Te-rich Cd—Zn—Te melt would weigh in the range about 23 kg. After growth, given the cadmium, zinc, and tellurium elemental composition of the CdZnTe crystal, along with the mass of the CdZnTe crystal, the elemental composition of the cadmium, zinc, and tellurium removed from the Te-rich Cd—Zn—Te melt during growth can be determined. Since a solid CdZnTe source is utilized as described more fully herein, the elemental composition of the cadmium, zinc, and tellurium can be determined that should be added to the crucible for the next crystal growth run. Thus, a reusable solid source/melt system is provided by embodiments of the present invention.

FIG. 1A is a simplified schematic diagram illustrating a CdZnTe crystal growth system at a first stage of crystal growth according to an embodiment of the present invention. As illustrated in FIG. 1A, the CdZnTe crystal growth system 100 includes a crucible 110, a CdZnTe solid source 120, also referred to as a CdZnTe solid source, disposed in crucible 110, a Te-rich Cd—Zn—Te melt 122 floating on CdZnTe solid source 120, and an encapsulating layer 124, for example, a boron oxide ($B_2O_3$) layer, floating on Te-rich Cd—Zn—Te melt 122. In some embodiments, the crucible is fabricated using quartz, boron nitride, aluminum oxide, or the like.

As described more fully below, the use of CdZnTe solid source 120 disposed in crucible 110 at a position below Te-rich Cd—Zn—Te melt 122 improves control of the zinc and/or cadmium concentration in Te-rich Cd—Zn—Te melt 122 during growth and results in a more uniform composition of the growing crystal. Moreover, the use of Te-rich Cd—Zn—Te melt 122 results in a lowering of the cadmium and zinc partial pressure over the Te-rich Cd—Zn—Te melt during growth of the CdZnTe crystal. Additionally, encapsulating layer 124 serves as an encapsulant layer to reduce or minimize evaporation of cadmium, zinc, and/or tellurium into the growth system environment during the crystal growth process, enhancing control over the composition of the CdZnTe crystal. As discussed more fully in relation to FIG. 9 below, the thickness (measured in the longitudinal or z-direction) of encapsulating layer 124 can be selected to enable the as-grown CdZnTe crystal to be fully enclosed in a liquid encapsulating layer, for example, boron oxide, after growth during a cooling process.

In one embodiment, pre-reacted CdZnTe and $B_2O_3$ can be loaded into the crucible and the system brought to the melting point of the CdZnTe so as to melt the pre-reacted ingots and form a fully dense solid covered with $B_2O_3$. After this is performed, the crucible can be brought to room temperature to load the Te-rich Cd—Zn—Te solution, and the seed loaded in the growth system. The crucible is then heated to the operating temperature under a temperature profile shown in FIG. 4A. In this embodiment, the fully loaded crystal growth system is operated in an inert atmosphere (e.g., $N_2$, Ar, or the like), or a hydrogen mixed with an inert gas environment or hydrogen alone. The pressure surrounding the crystal growth system can be maintained at atmospheric pressure or at a pressure higher than atmospheric pressure. One of ordinary skill in the art would recognize many variations, modifications, and alternatives.

In order to prepare for crystal growth in some other embodiments, the charge of Te-rich Cd—Zn—Te solid source material is loaded in the crucible (e.g., in situ) and brought to a molten state using one or more external heaters. Once in a molten state, a heating element is inserted into the molten Te-rich solution to carefully control the temperature of the lower dissolving CdZnTe/Te-rich melt interface. Thus, as illustrated in FIG. 1A, crucible 110 includes CdZnTe solid source 120 with Te-rich Cd—Zn—Te melt 122 disposed on top of the CdZnTe solid source.

Referring to FIG. 1A, CdZnTe crystal seed 130 is supported by shaft 132, which is operable to rotate, for example, introducing a counter rotation with respect to crucible 110, which can also be operable to rotate using a rotation system (not shown). As illustrated in FIG. 1A, CdZnTe crystal seed 130 is positioned in physical contact with Te-rich Cd—Zn—Te melt 122 at the interface between Te-rich CdZnTe melt 122 and encapsulating layer 124. The tellurium rich CdZnTe melt provides buoyancy to the CdZnTe crystal seed 130, causing it to effectively float on the tellurium rich CdZnTe melt. In order to control the doping level of the growing ingot as it solidifies, an optional injector 140 can be utilized to add desired dopants like In, Cu, or other dopants during growth. As the growth process proceeds, the composition of the Te-rich Cd—Zn—Te melt may vary as the elements in the Te-rich CdZnTe melt are extracted by solidification of the CdZnTe crystal. As the crystal grows, it depletes the melt of the three elements, as a result the bottom source dissolves into the depleted Te-rich Cd—Zn—Te melt that is taken out of equilibrium as a result of the growing crystal. That is, a chemical potential or composition gradient is set up between the bottom, dissolving, and the top, growing, interface, thus providing the driving force for crystal growth. In some embodiments, metrology associated with the crystal growth system can be utilized to measure elemental composition, whereas in other embodiments, post-growth analysis is utilized to characterize the elemental composition as a function of longitudinal position. In subsequent growth runs, the elemental composition can then be controlled to produce the desired elemental composition as a function of longitudinal position. In some embodiments, one or more valves, represented by valve 141, can be used to introduce one or more elements, which will typically be introduced in solid form through injector 140, also referred to as an injection pipe, and then be incorporated into the Te-rich Cd—Zn—Te melt as the elements melt into the Te-rich Cd—Zn—Te melt. Thus, embodiments of the present invention provide for the injection of zinc, cadmium, and/or tellurium into the Te-rich Cd—Zn—Te melt to modify a stoichiometry of the Te-rich Cd—Zn—Te melt. According to some embodiments, the thickness of the Te-rich Cd—Zn—Te melt ranges from several millimeters (e.g., 1-5 mm) to several centimeters (e.g., 1-10 cm). Additionally, the thickness of the Te-rich Cd—Zn—Te melt may vary as a function of the diameter of the CdZnTe crystal.

Figure 1B:
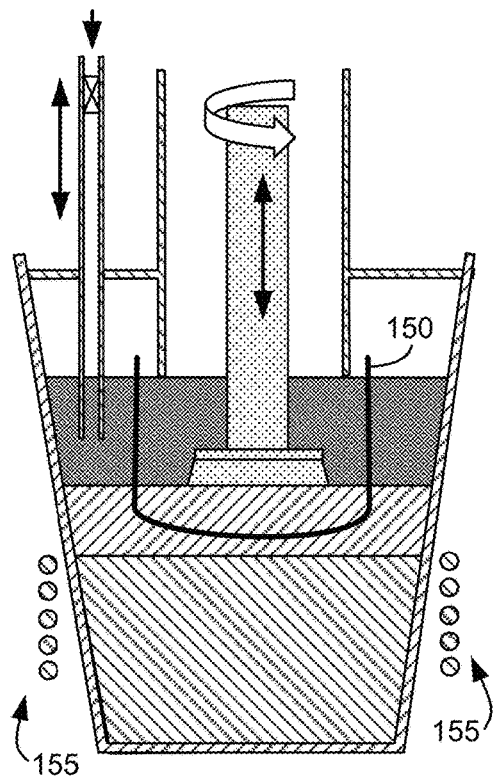
FIG. 1B is a simplified schematic diagram illustrating a CdZnTe crystal growth system at a first stage of crystal growth according to an embodiment of the present invention.

FIG. 1B is a simplified schematic diagram illustrating a CdZnTe crystal growth system at a second stage of crystal growth according to an embodiment of the present invention. In order to extend Te-rich Cd—Zn—Te melt 122 into CdZnTe solid source 120, a heating element 150 positioned in Te-rich Cd—Zn—Te melt 122 is translated toward CdZnTe solid source 120 (i.e., down toward the bottom of Te-rich Cd—Zn—Te and CdZnTe source). A variety of heater geometries can be utilized according to embodiments of the present invention, including an annular heater with a planar geometry, an annular heater with a vertical geometry as illustrated by heating element 750 in FIG. 7B, a plate heater having a plurality of holes passing through the plate, a spiral heater with resistive heating elements disposed in a spiral pattern in a plane, combinations thereof, and the like.

Figure 1C:
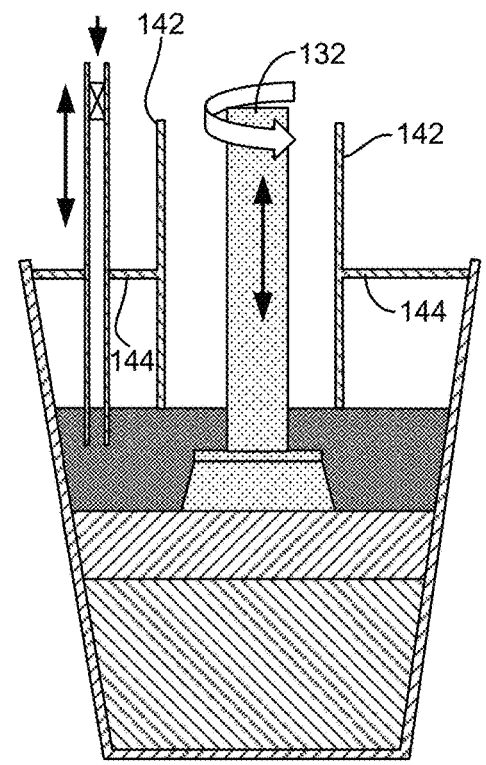
FIG. 1C is a simplified schematic diagram illustrating a CdZnTe crystal growth system at a first stage of crystal growth according to an embodiment of the present invention.

Although heating element 150 is not illustrated in FIG. 1A for purposes of clarity, it will be appreciated that heating element 150 will be present in the embodiment illustrated in FIG. 1A as well as the embodiment illustrated in FIG. 1C. In addition to heating element 150, an external heater 155 (illustrated as portions of the heating elements intersecting the plane of the figure surrounding crucible 110) can also be utilized according to embodiments of the present invention as illustrated by external heater 720 as discussed in relation to FIG. 7A. One of ordinary skill in the art would recognize many variations, modifications, and alternatives. As heating element 150 is translated toward CdZnTe solid source 120, cooling of the upper surface of Te-rich Cd—Zn—Te melt 122 enables the growth of the CdZnTe crystal from the seed crystal to be increased or initiated.

As CdZnTe crystal grows and extends in length, the Te-rich Cd—Zn—Te melt 122 surface position lowers as the CdZnTe solid source 120 decreases in volume due to its dissolution as the CdZnTe grows above the Te-rich Cd—Zn—Te melt. Although FIG. 1B illustrates the bottom surface of CdZnTe crystal floating on the Te-rich Cd—Zn—Te melt 122, it will be appreciated that the bottom surface of the CdZnTe crystal may be below the surface of the Te-rich Cd—Zn—Te melt, for example, by a few mm, for example, 1 mm to 50 mm depending on the Te-rich Cd—Zn—Te melt thickness. During the whole crystal growth process, the growing CdZnTe single crystal is covered by the encapsulating layer.

Figure 4A:
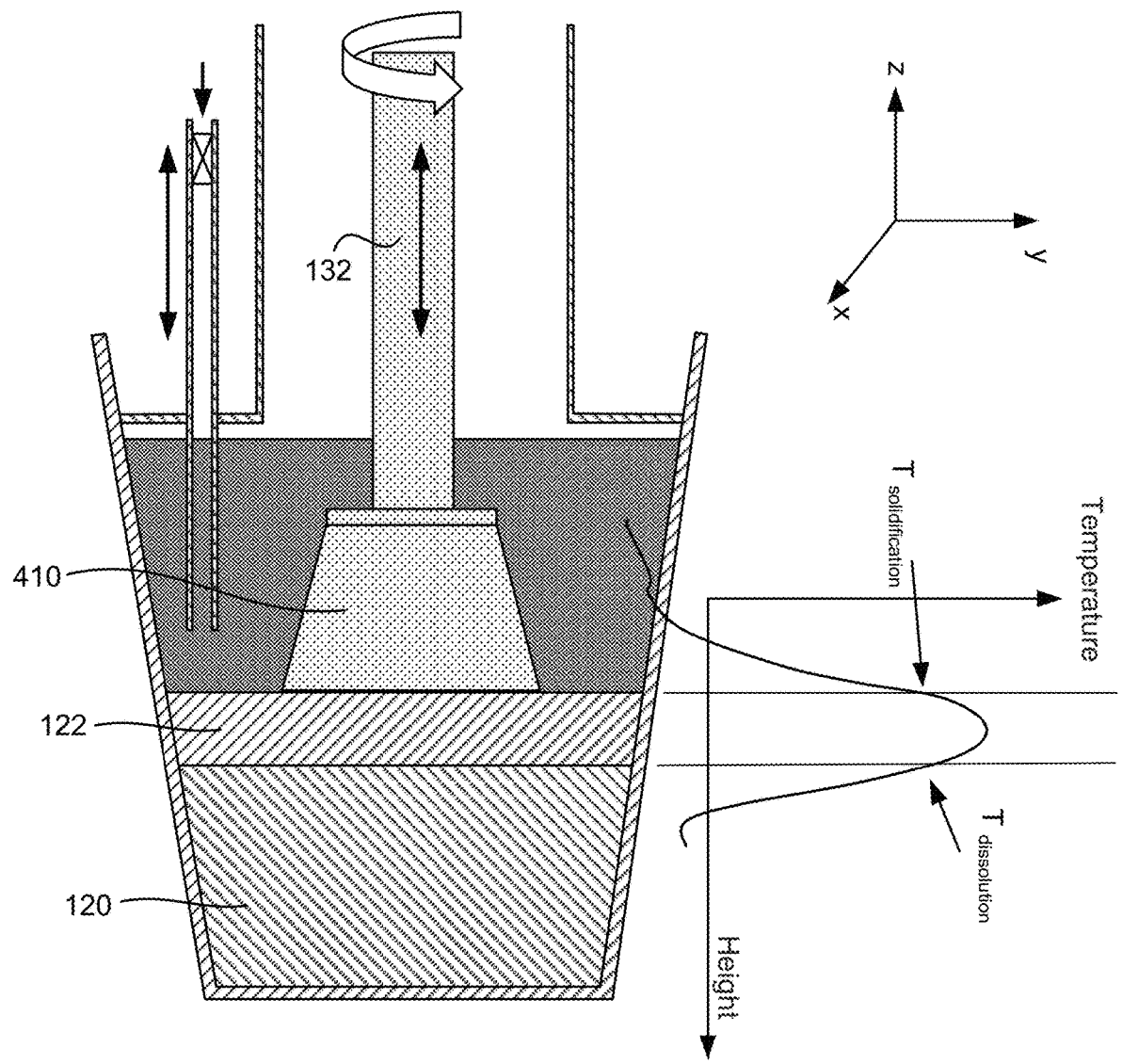
FIG. 4A is a simplified schematic diagram illustrating a vertical temperature profile for the CdZnTe crystal growth system illustrated in FIG. 1A.
Figure 4B:
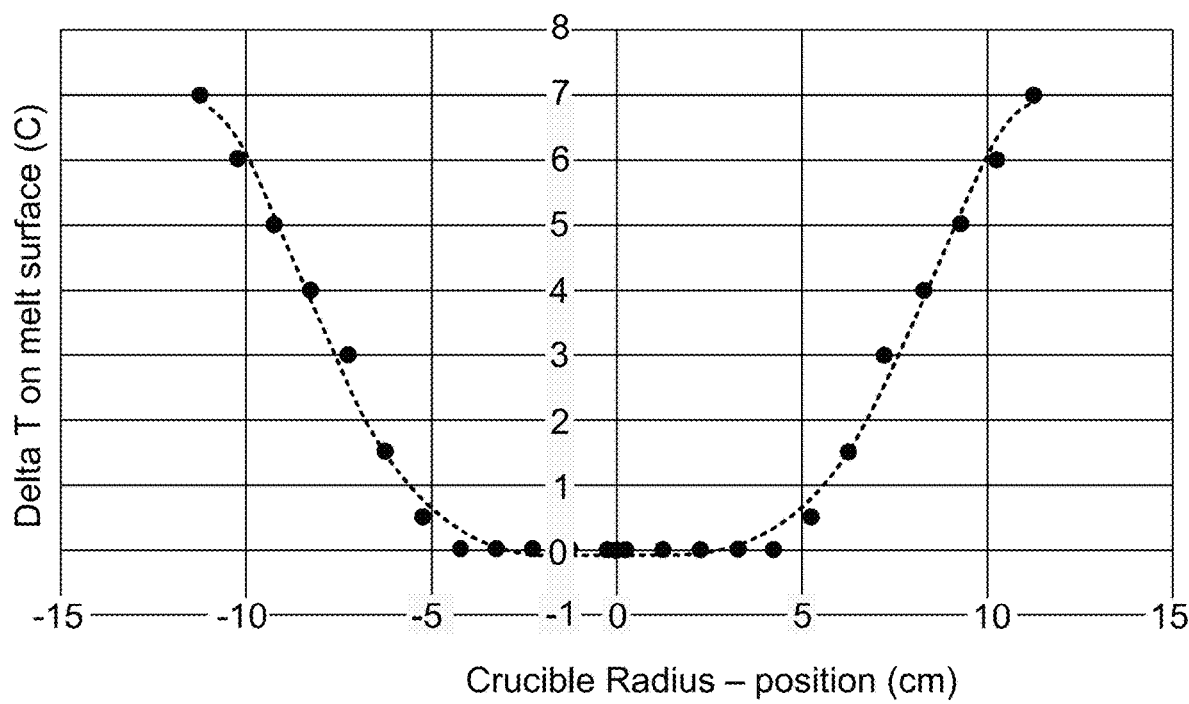
FIG. 4B is a simplified schematic diagram illustrating a lateral temperature profile for the CdZnTe crystal growth system illustrated in FIG. 4B.

FIG. 1C is a simplified schematic diagram illustrating a CdZnTe crystal growth system at a third stage of crystal growth according to an embodiment of the present invention. Referring to FIG. 1C, vertical shields 142 and horizontal shields 144 are positioned around shaft 132 to control the growth environment. In particular, vertical shields 142 and horizontal shields 144 are utilized to control the vertical temperature profile as illustrated in FIG. 4A and the lateral temperature profile as illustrated in FIG. 4B and may be referred to as temperature shields. Although not illustrated in FIG. 1C, in addition to one or more motors to translate shaft 132 vertically and to rotate shaft 132, one or more motors can be provided to raise/lower crucible 110 as well as rotate the crucible in some embodiments.

FIG. 4A is a simplified schematic diagram illustrating a vertical temperature profile for the CdZnTe crystal growth system illustrated in FIG. 1A. As illustrated in FIG. 4, the vertical temperature profile plots the temperature as a function of height. It will be appreciated that although the vertical temperature profile illustrated in FIG. 4A is discussed in relation to the CdZnTe crystal growth system illustrated in FIG. 1A, the discussion is also applicable to the CdZnTe crystal growth systems illustrated in FIGS. 1B and 1C as appropriate. Referring to FIG. 4A, lateral planes are defined in the x-y plane, i.e., horizontal planes, and longitudinal dimensions are defined in the z-direction, i.e., vertical dimensions. As the CdZnTe single crystal boule grows, the boule can be characterized by a diameter measured in the lateral directions and a length in the longitudinal direction.

Referring to FIG. 4A, the temperature profile indicates that the temperature at the top of the Te-rich Cd—Zn—Te melt is equal to the solidification temperature ($T_{solidification}$) of CdZnTe from the Te-rich Cd—Zn—Te melt and the temperature at the bottom of the Te-rich Cd—Zn—Te melt (i.e., at the interface between the Te-rich Cd—Zn—Te melt and the solid CdZnTe source) is equal to the dissolution temperature ($T_{dissolution}$) of CdZnTe into the Te-rich Cd—Zn—Te melt. As will be evident to one of skill in the art, the formation of the CdZnTe crystal results in extraction of heat from the Te-rich Cd—Zn—Te melt. Additionally, heat is conducted up shaft 132. Accordingly, active heating/cooling of the system is provided as described herein.

The temperature gradient present in the Te-rich Cd—Zn—Te melt results in a concentration gradient from the lower surface of the Te-rich Cd—Zn—Te melt to the upper surface of the Te-rich Cd—Zn—Te melt. As the cadmium, zinc, and tellurium are depleted from the Te-rich Cd—Zn—Te melt as a result of the crystal growth, additional cadmium and zinc, as well as additional tellurium, are dissolved from the upper surface of the solid CdZnTe source, thereby entering the Te-rich Cd—Zn—Te melt. Accordingly, as elements are depleted during growth, replacement elements are provided by the melting of the solid CdZnTe source. The growth process can be considered in the light of transfer of polycrystalline/disordered CdZnTe from the solid CdZnTe source to a crystalline state of the growing CdZnTe crystal. Thus, in contrast with methods that pull the crystal from a melt, embodiments of the present invention translate the Te-rich Cd—Zn—Te melt down into the solid CdZnTe source in order to grow the CdZnTe crystal as the cooler temperature at the top of the Te-rich Cd—Zn—Te melt compared to the bottom of the Te-rich Cd—Zn—Te melt results in crystal growth together with replenishment of the Te-rich Cd—Zn—Te melt, i.e. continuous adjustment of the composition.

Figure 3:
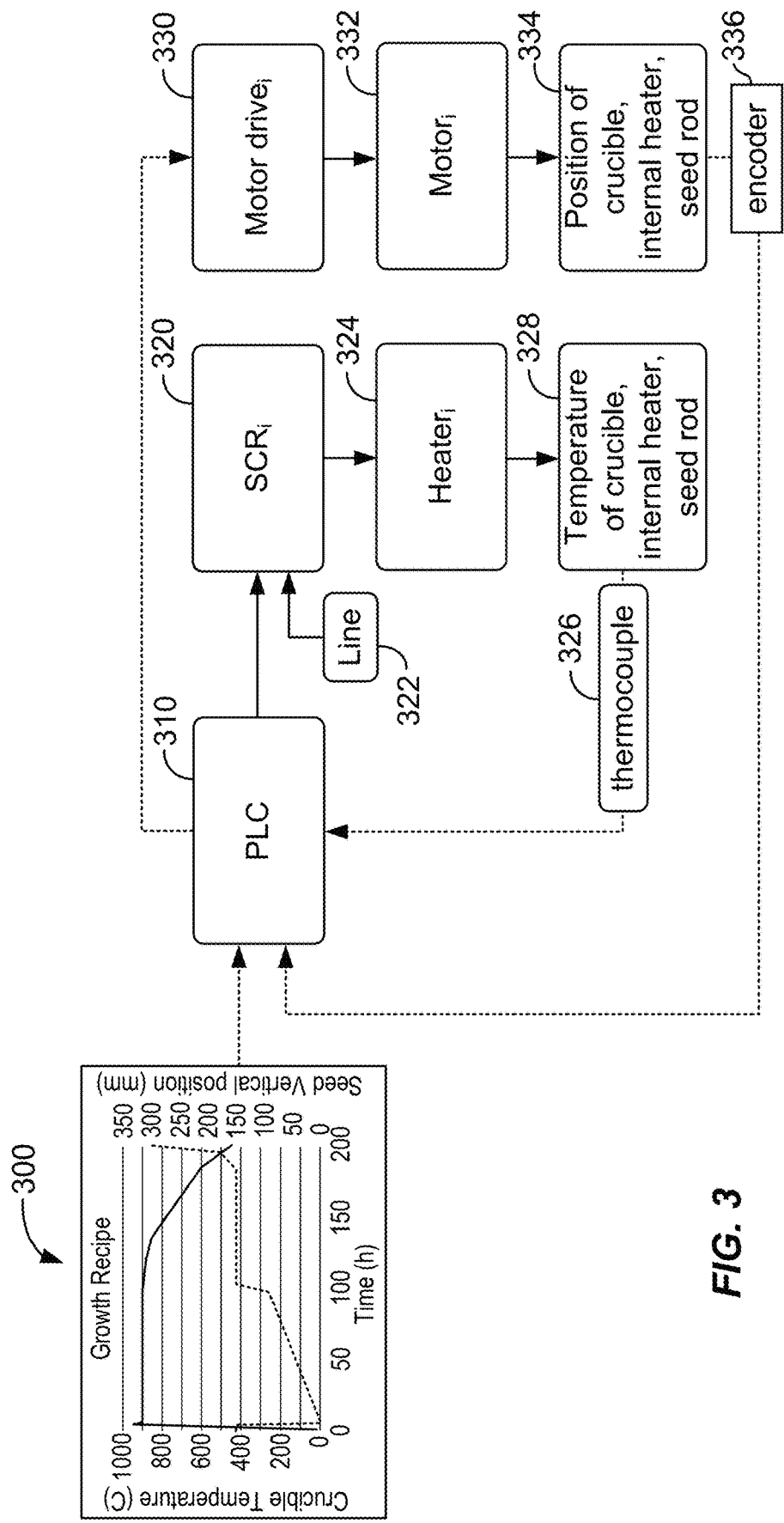
FIG. 3 is a simplified schematic diagram illustrating a control system for crystal growth according to an embodiment of the present invention.

FIG. 3 is a simplified schematic diagram illustrating a control system for crystal growth according to an embodiment of the present invention. As illustrated in FIG. 3, a growth recipe 300 defining the crucible temperature (in ° C.), for example, ranging from about 600° C. to about 1050° C., as a function of time and the seed crystal vertical (also referred to as longitudinal) position (in mm) as a function of time is provided. In order to implement this growth recipe 300, a programmable logic controller (PLC) 310 receives growth recipe 300. The PLC 310 provides inputs to silicon-controlled-rectifier ($SCR_i$) 320 as well as to motor drive 330, thereby providing for two control paths: heating element control and seed crystal position control, respectively. In FIG. 3, subscripts are utilized to communicate the identity of the element among multiple elements. For example, in some embodiments, a plurality of heaters are utilized: an external heater to introduce heat into the crucible (e.g., $Heater_1$), an internal heater to introduce heat into the Te-rich Cd—Zn—Te melt (e.g., $Heater_2$), and a seed crystal heater to introduce heat into the seed crystal and supporting rod (e.g., $Heater_3$). Thus, subscripts can be utilized to denote the various heaters of the multiple heaters utilized in various embodiments.

Figure 7A:
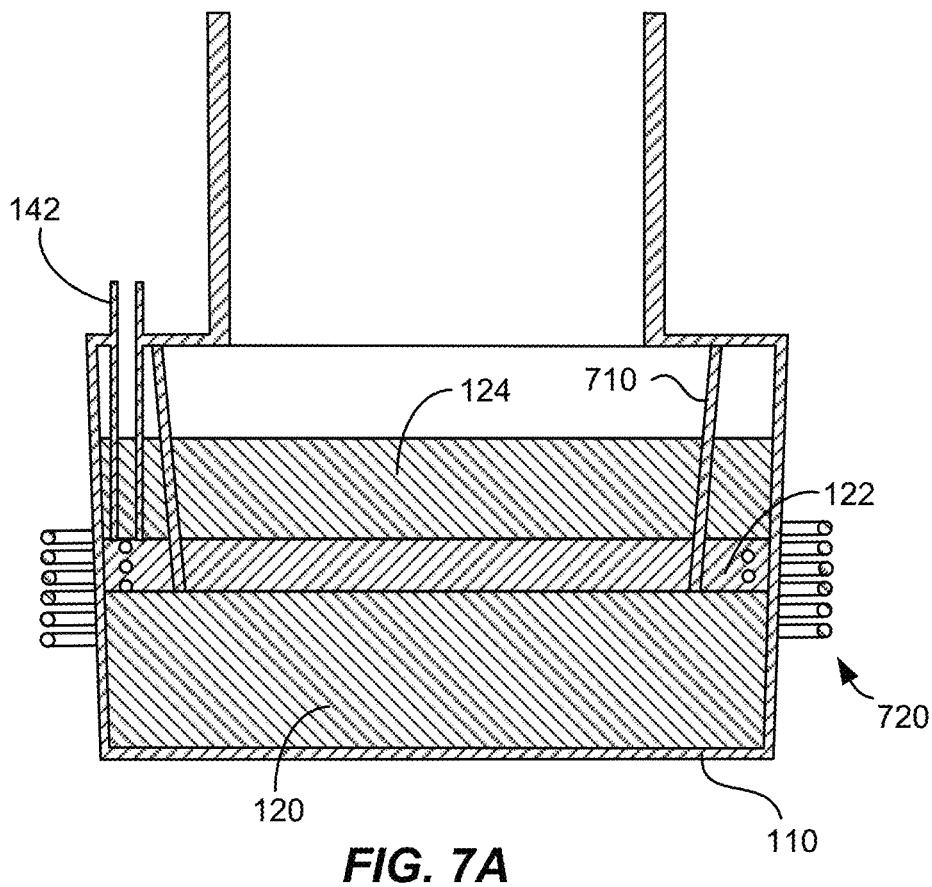
FIG. 7A is a simplified schematic diagram illustrating elements of a CdZnTe crystal growth system according to an embodiment of the present invention.
Figure 7B:
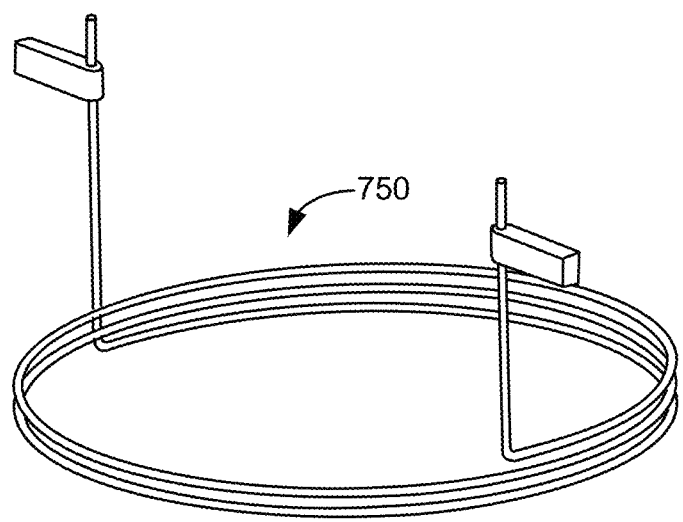
FIG. 7B is a simplified schematic diagram illustrating a heating element of a CdZnTe crystal growth system according to an embodiment of the present invention.

$SCR_i$ 320 receives line power (322) and provides an input to $Heater_i$ 324, which can be implemented as heating element 750 described in relation to FIG. 7B although other implementations are included within the scope of the present invention. As illustrated in FIG. 3, the crucible temperature, the temperature of the melt, and the temperature of the seed crystal rod or holder (328) can be controlled using the appropriate heater. Thermocouple 326 or other suitable temperature measurement device is utilized to determine the temperature of the various elements, for example, the crucible temperature, which is, in turn, fed back into PLC 310.

In order to control the seed crystal position, $Motor\ drive_i$ 330 receives an input from PLC 310 and is used to drive $Motor_i$ 332 that is mechanically coupled to the seed crystal. As discussed above in relation to the use of multiple heaters, subscripts can be utilized to denote various motors utilized by embodiments of the present invention. Thus, as illustrated in FIG. 3, the position of the seed crystal rod, the crucible, and the internal heater (334) can be controlled. Encoder 336 or other suitable position measurement device is utilized to determine the position of the various elements, for example, the seed crystal position, which is, in turn, fed back into PLC 310.

Figure 5:
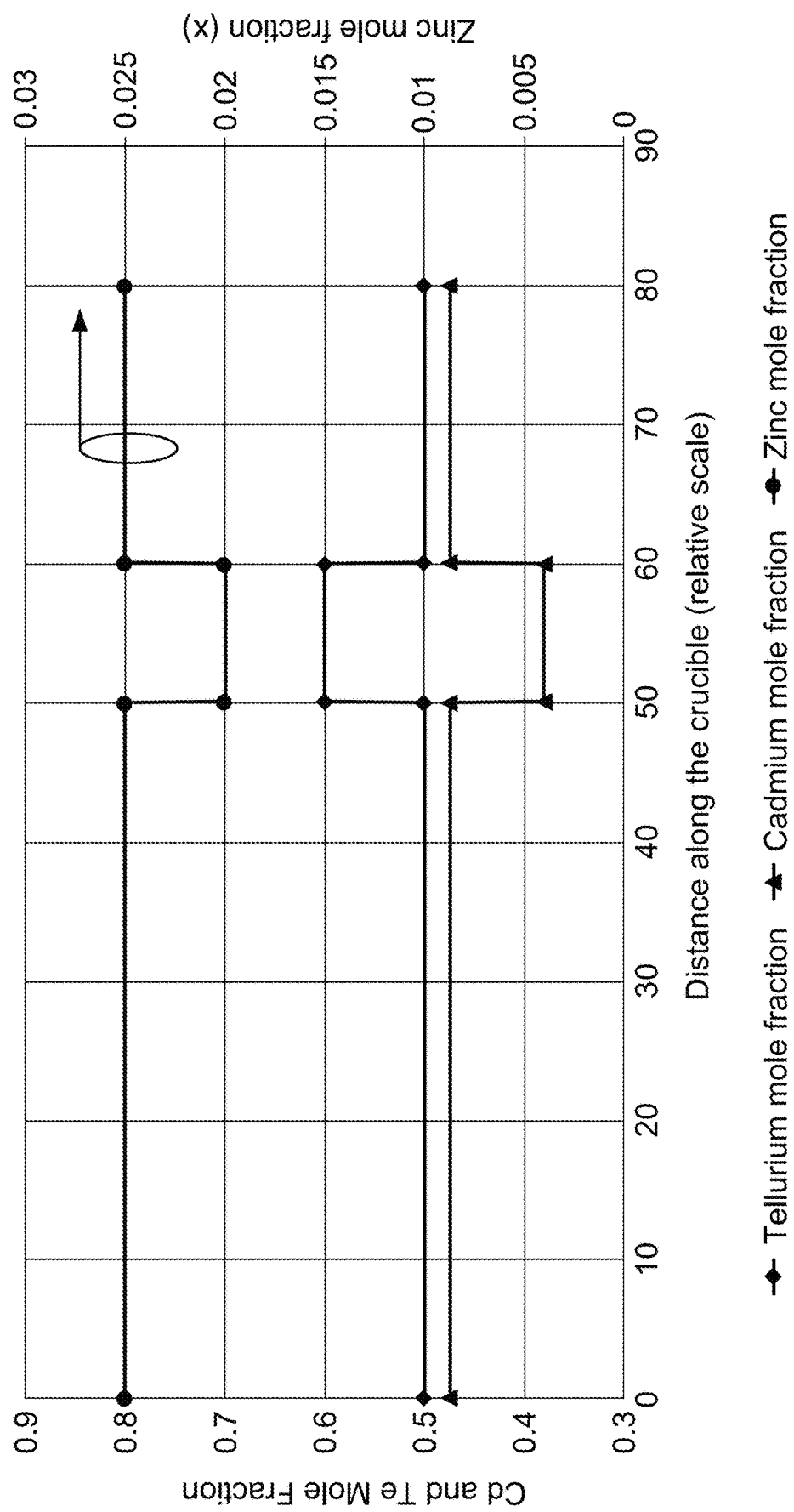
FIG. 5 is a simplified plot of cadmium, zinc, and tellurium concentrations as a function of longitudinal position according to an embodiment of the present invention.

FIG. 5 is a simplified plot of cadmium, zinc, and tellurium concentrations as a function of longitudinal position according to an embodiment of the present invention. In FIG. 5, the Te-rich Cd—Zn—Te melt is present at crucible distances (relative scale) from 50 to 60. As illustrated in FIG. 5, the zinc mole fraction ranges from 2.0% to 2.5%, i.e., 2.5% above and below the Te-rich Cd—Zn—Te melt and 2.0% in the Te-rich Cd—Zn—Te melt. The cadmium and tellurium mole fractions range from 47.5% to 38% and from 50% to 60%, respectively. In other embodiments, the zinc mole fraction ranges from 0% to 15%, for example, from 2.5% to 5%, in a specific embodiment, 3.5%. The use of the Te-rich Cd—Zn—Te melt enables lower growth temperatures since the phase diagram for CdZnTe provides lower formation temperatures for tellurium rich melts. These lower temperatures, in turn, result in the reduction of the cadmium partial pressure, thereby simplifying the growth system and improving compositional control.

FIG. 4B is a simplified schematic diagram illustrating a lateral temperature profile for the CdZnTe crystal growth system illustrated in FIG. 4B. Referring to FIG. 4B, the temperature of the Te-rich Cd—Zn—Te melt (for example, taken at the top surface of the Te-rich Cd—Zn—Te melt) is illustrated as a function of lateral (i.e., horizontal) position measured as a function of crucible radius. As illustrated in FIG. 4B, the temperature of the Te-rich Cd—Zn—Te melt is higher near the walls of the crucible than near the center of the crucible, for example, varying by difference of about 6° C. from positions near the walls to positions near the center of the crucible. Depending on the composition of the Te-rich Cd—Zn—Te melt, the absolute value of the temperature difference of the Te-rich Cd—Zn—Te melt, from the edge of the crucible to the center of the crucible where the CdZnTe crystal is growing, can vary. Thus, the illustrated temperature difference of about 6° C. is provided merely by way of illustration and is not intended to limit embodiments of the present invention. The vertical shields and the horizontal shields are utilized to assist in the control of the lateral temperature profile as illustrated in FIG. 4B. Moreover, the shape(s) utilized for heating element 750, as described more fully in relation to FIGS. 7A and 7B, is utilized to assist in the control of the lateral temperature profile as illustrated in FIG. 4B.

In some embodiments, a radial temperature gradient is maintained in the lateral or horizontal plane of the Te-rich Cd—Zn—Te melt such that the melt surface temperature is higher temperature at the edge of the melt region than at the center of the Te-rich Cd—Zn—Te melt (e.g., at the center of the crucible) so that as the CdZnTe crystal grows, the top surface of the Te-rich Cd—Zn—Te melt that is not in contact with the crystal will not crystallize. The prevention of solidification at lateral positions of the Te-rich Cd—Zn—Te melt not in contact with the CdZnTe crystal is thus provided by the vertical and horizontal shields and/or use of heating elements as described herein.

Figure 2:
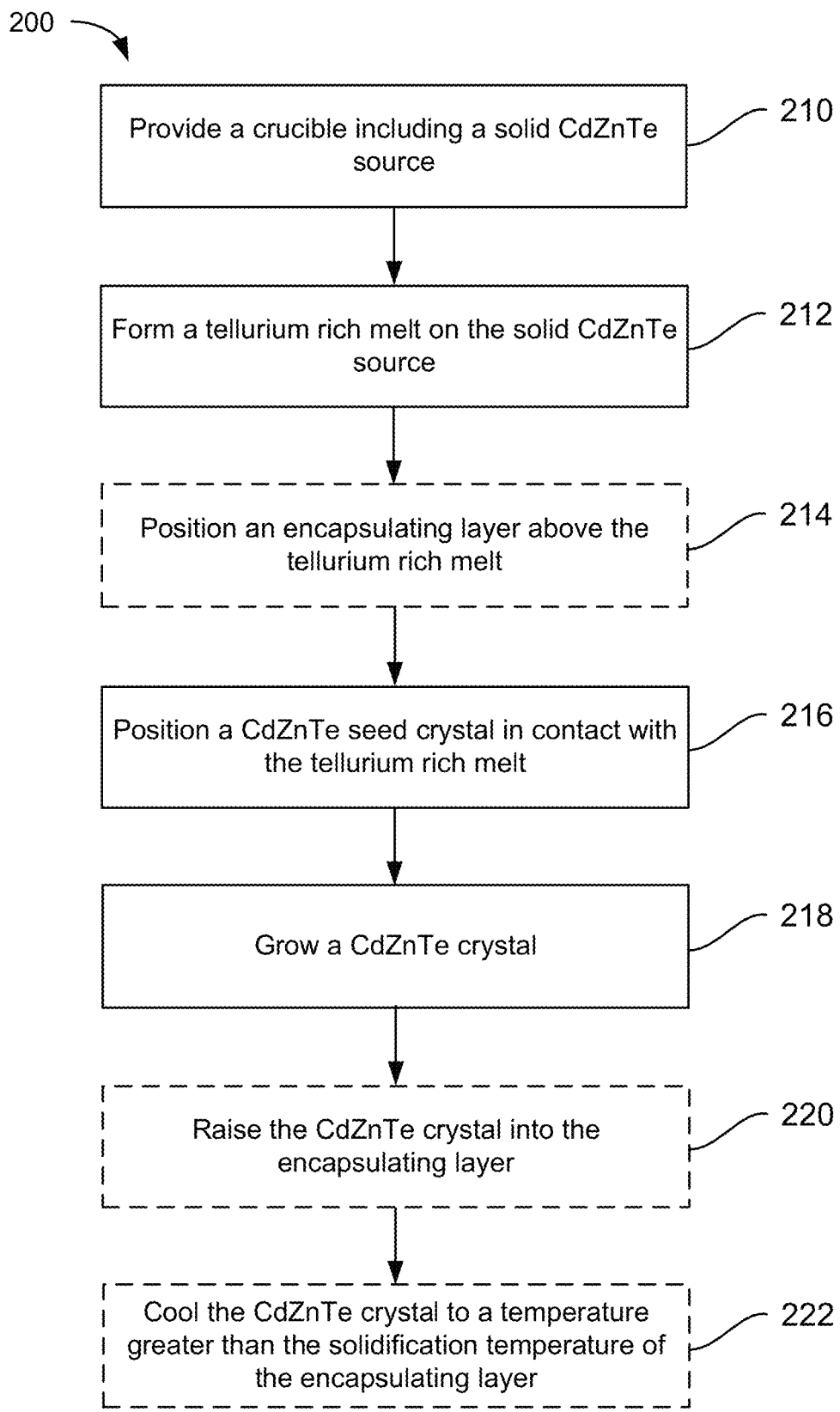
FIG. 2 is a simplified flowchart illustrating a method of growing a CdZnTe crystal according to an embodiment of the present invention.

FIG. 2 is a simplified flowchart illustrating a method of growing a CdZnTe crystal according to an embodiment of the present invention. The method 200 includes providing a crucible including a solid CdZnTe source (210) and forming a Te-rich Cd—Zn—Te melt on the solid CdZnTe source (212). The Te-rich Cd—Zn—Te melt can be considered as an isothermal supersaturated solution. A melt interface is defined by a surface of the solid CdZnTe source and a melt surface of the Te-rich Cd—Zn—Te melt.

The method also includes positioning a CdZnTe seed crystal in physical contact with the Te-rich Cd—Zn—Te melt (216) and growing the CdZnTe crystal from the tellurium rich melt (218). The CdZnTe crystal can be grown as a bulk single CdZnTe crystal. In some embodiments, growing the CdZnTe crystal includes moving the Te-rich Cd—Zn—Te melt towards the solid CdZnTe source. In other words, as the CdZnTe source is consumed by the growing single crystal, the Te-rich melt surface is lowered as the growing single crystal grows downwards, for example, in the absence of pulling. As described herein, the Te-rich Cd—Zn—Te melt is defined by a growth surface opposing the solid CdZnTe source and positioning the CdZnTe seed crystal in physical contact with the Te-rich Cd—Zn—Te melt includes positioning a growth surface of the CdZnTe seed crystal on the growth surface of the Te-rich Cd—Zn—Te melt.

The growth interface is defined by the growth surface of the CdZnTe crystal and a surface of the Te-rich Cd—Zn—Te melt. Thus, growing the CdZnTe crystal can include cooling the seed (e.g., growth interface) to a temperature below the liquidus temperature. During growth, the melt interface can be translated into the solid CdZnTe source, thereby pushing the melt interface down into the solid CdZnTe source. As an example, a heating element positioned in the Te-rich Cd—Zn—Te melt can be moved down toward the solid CdZnTe source. Moreover, rotation or a combination of clockwise and counterclockwise rotation, which may be referred to as an accelerated crucible rotation technique (ACRT), of the CdZnTe seed crystal and/or crucible or a combination thereof can be performed while growing the CdZnTe crystal.

In some embodiments, the method includes positioning a encapsulating layer on the Te-rich Cd—Zn—Te melt, for example, boron oxide, which can also be referred to as an encapsulant layer (214). In embodiments that utilize an encapsulation layer, the method can also include, after growing the CdZnTe crystal, raising the CdZnTe crystal into the encapsulating layer (220) and cooling the CdZnTe crystal to a temperature greater than the solidification temperature of encapsulating layer (222). Moreover, in some embodiments, after growing the CdZnTe crystal, the method can include supporting the CdZnTe crystal using a lift mechanism and lifting the CdZnTe crystal into the encapsulating layer.

In order to control or modify the stoichiometry of the Te-rich Cd—Zn—Te melt, an injector can be used to inject zinc, cadmium, and/or tellurium into the Te-rich Cd—Zn—Te melt. Also, in order to modify or control doping levels of the tellurium rich CdZnTe melt, indium or other dopants can be injected into the Te-rich Cd—Zn—Te melt.

It should be appreciated that the specific steps illustrated in FIG. 2 provide a particular method of growing a CdZnTe crystal according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
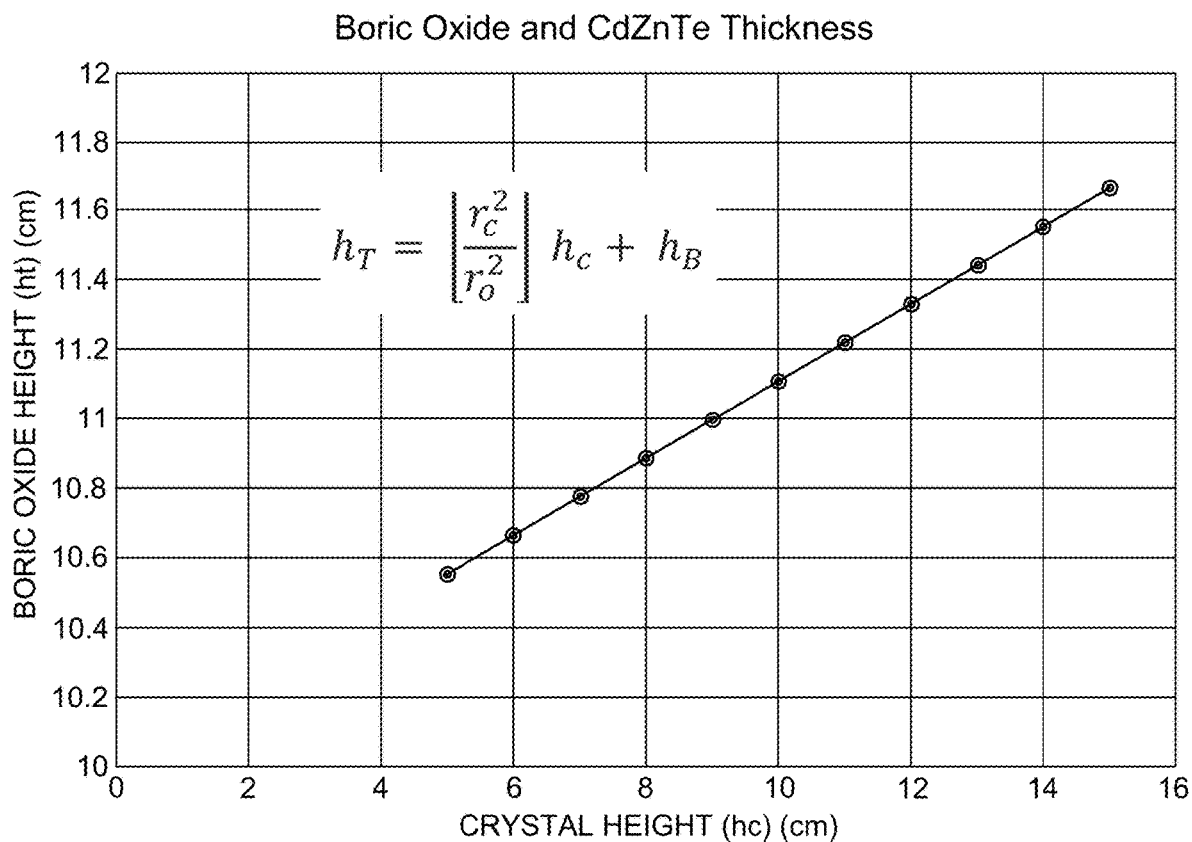
FIG. 6 is a simplified plot illustrating encapsulating layer height as a function of CdZnTe crystal height according to an embodiment of the present invention.

FIG. 6 is a simplified plot illustrating encapsulating layer height as a function of CdZnTe crystal height according to an embodiment of the present invention. As illustrated in FIG. 6, the encapsulating layer height ($h_T$) can be represented by the function:

$$h_T = \left[\frac{r_c^2}{r_o^2}\right] h_c + h_B,$$

where $r_c$ is the radius of the CdZnTe crystal, $r_o$ is the crucible radius, $h_c$ is the height of the crystal, and $h_B$ is the encapsulating layer height.

FIG. 7A is a simplified schematic diagram illustrating elements of a CdZnTe crystal growth system according to an embodiment of the present invention. In FIG. 7A, a baffle 710 is utilized at locations between the CdZnTe crystal and the walls of crucible 110 to provide an aperture in the encapsulating layer. Baffle 710 assists in displacing defects or particles associated with the crucible walls. In the embodiment illustrated in FIG. 7A, which is applicable to the systems discussed in relation to FIGS. 1A-1C, baffle 710 is tapered so that as the CdZnTe crystal grows, the lateral dimension of the baffle increases in a manner corresponding to the increase in CdZnTe crystal diameter. External heater 720 is utilized to introduce heat into the crucible and is adjustable in the longitudinal direction as the Te-rich Cd—Zn—Te melt is lowered into the solid CdZnTe source during crystal growth.

In some embodiments, a double annular heating element is utilized. In these embodiments, a first heating element (e.g., the outer annular heating element) is utilized to control the lateral and vertical temperature profile as the first heating element is translated down toward the solid CdZnTe source, and the second heating element (e.g., the inner annular heating element) is utilized to control the melting of the solid CdZnTe source as the second heating element is translated down toward the solid CdZnTe source. In these embodiments, the first heating element and the second heating element can be aligned in the same lateral plane (i.e., at a same longitudinal or vertical position) or can be positioned at different longitudinal or vertical positions. One of ordinary skill in the art would recognize many variations, modifications, and alternatives.

FIG. 7B is a simplified schematic diagram illustrating a heating element of a CdZnTe crystal growth system according to an embodiment of the present invention. The heating element 750, which can be implemented as an annular heater formed by filling a hollow quartz tube with a liquid (such as gallium) or a solid (such as FeCrAl-alloy) conductor that acts as a resistive heating element, is positioned in Te-rich Cd—Zn—Te melt 122 to inject heat into the Te-rich Cd—Zn—Te melt. In some embodiments, the diameter of heating element 750 is several centimeters larger than the largest diameter of the CdZnTe crystal boule. Additional hollow quartz tubes including thermocouples or other temperature sensors can be integrated with one or more of the annular heater elements to provide temperature information for the Te-rich Cd—Zn—Te melt that can be utilized to provide closed loop control of the temperature of the Te-rich Cd—Zn—Te melt. Referring once again to FIG. 4B, the combination of heat introduced using external heater 720 and heating element 750 provides the lateral temperature gradient illustrated in FIG. 4B. In some embodiments, additional heating elements are utilized in addition to heating element 750, not necessarily inside the melt. Accordingly, embodiments of the present invention are not limited to a single heating element. As an example, a grid heater can also be positioned in the Te-rich Cd—Zn—Te melt, for instance, laterally inside heating element 750 and at a longitudinal position above, below, or aligned with the heating element. Moreover, spiral geometries, interwoven geometries, or the like can be utilized within the scope of the present invention, such as heating element 150. Since the heat loss will typically vary radially, multiple zones can be utilized to account for radial variations, for example, a center zone surrounded or partially surrounded by one or more peripheral zones. In some embodiments, the resistive heating elements can be wound in a spiral pattern in a plane, form a grid of intersecting lines, or the like. One of ordinary skill in the art would recognize many variations, modifications, and alternatives.

It should be noted that the elements described in relation to the various embodiments described herein can be combined, for example, integration of heating element 750 into the system illustrated in FIG. 1A as described above. Thus, although various elements have been illustrated separately for purposes of clarity, the combination of these various elements in a combined system are included within the scope of the present invention.

Figure 8:
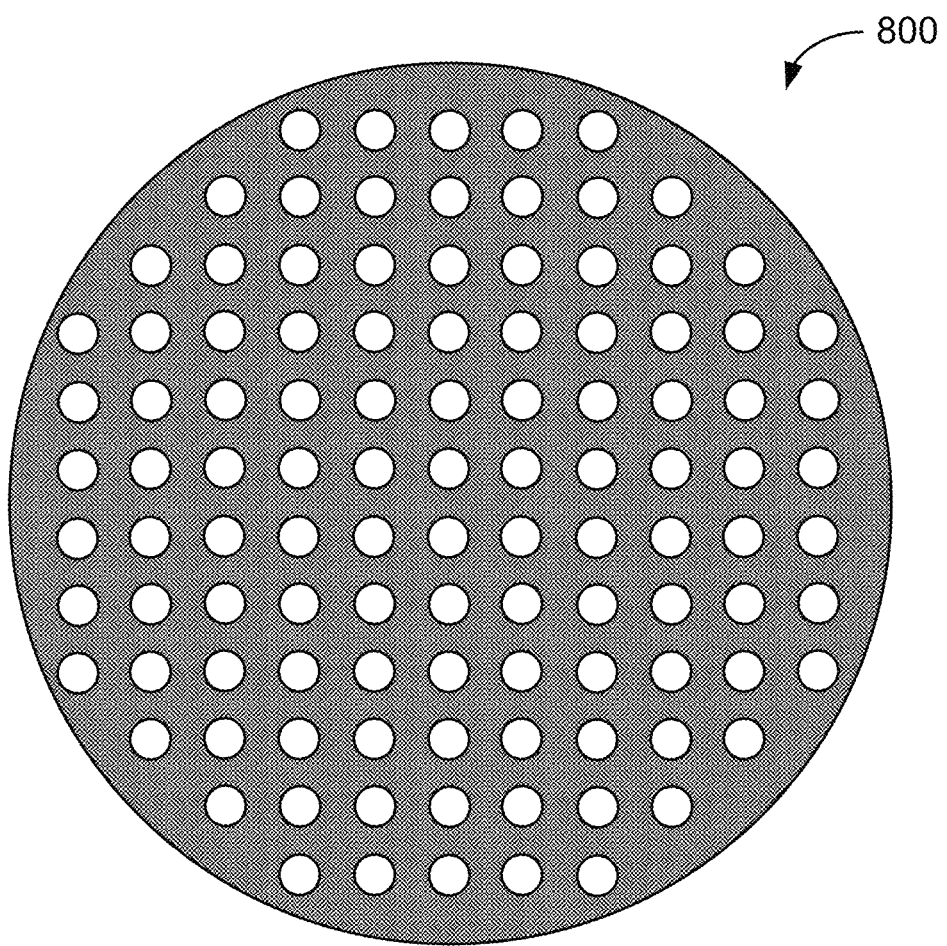
FIG. 8 is a simplified plan view diagram illustrating a baffle for use in the Te-rich Cd—Zn—Te melt according to an embodiment of the present invention.

FIG. 8 is a simplified plan view diagram illustrating a baffle for use in the Te-rich Cd—Zn—Te melt according to an embodiment of the present invention. Referring to FIG. 8, baffle 800 can be positioned in the Te-rich Cd—Zn—Te melt and utilized to decrease convection in the Te-rich Cd—Zn—Te melt while not limiting diffusion of elements in the Te-rich Cd—Zn—Te melt. In the example baffle 800 illustrated in FIG. 8, a grid of spaces are provided in a solid plate although other designs are included within the scope of the present invention. Positioned in the Te-rich Cd—Zn—Te melt, the baffle allows elements in the melt to move vertically in a constrained manner, reducing convective currents that would otherwise impair the crystal growth process. Thus, in addition to the use of a thin Te-rich Cd—Zn—Te melt to reduce convection, one or more baffles can be utilized to reduce convection-induced non-uniformities during growth, for example, depletion of zinc that can result in a gradient in zinc concentration, either along the length of the CdZnTe crystal or across the lateral dimension of the CdZnTe crystal, thereby providing a diffusion-limited melt in these embodiments.

In some embodiments, baffle 800 can be integrated as an element of the heating element. As an example, the heating element can include a series of tubes having decreasing diameter, connected by axial rods, which will allow diffusion while reducing convection. Additionally, the baffle can be integrated as an element of the lift mechanism described in relation to FIG. 9.

Figure 9:
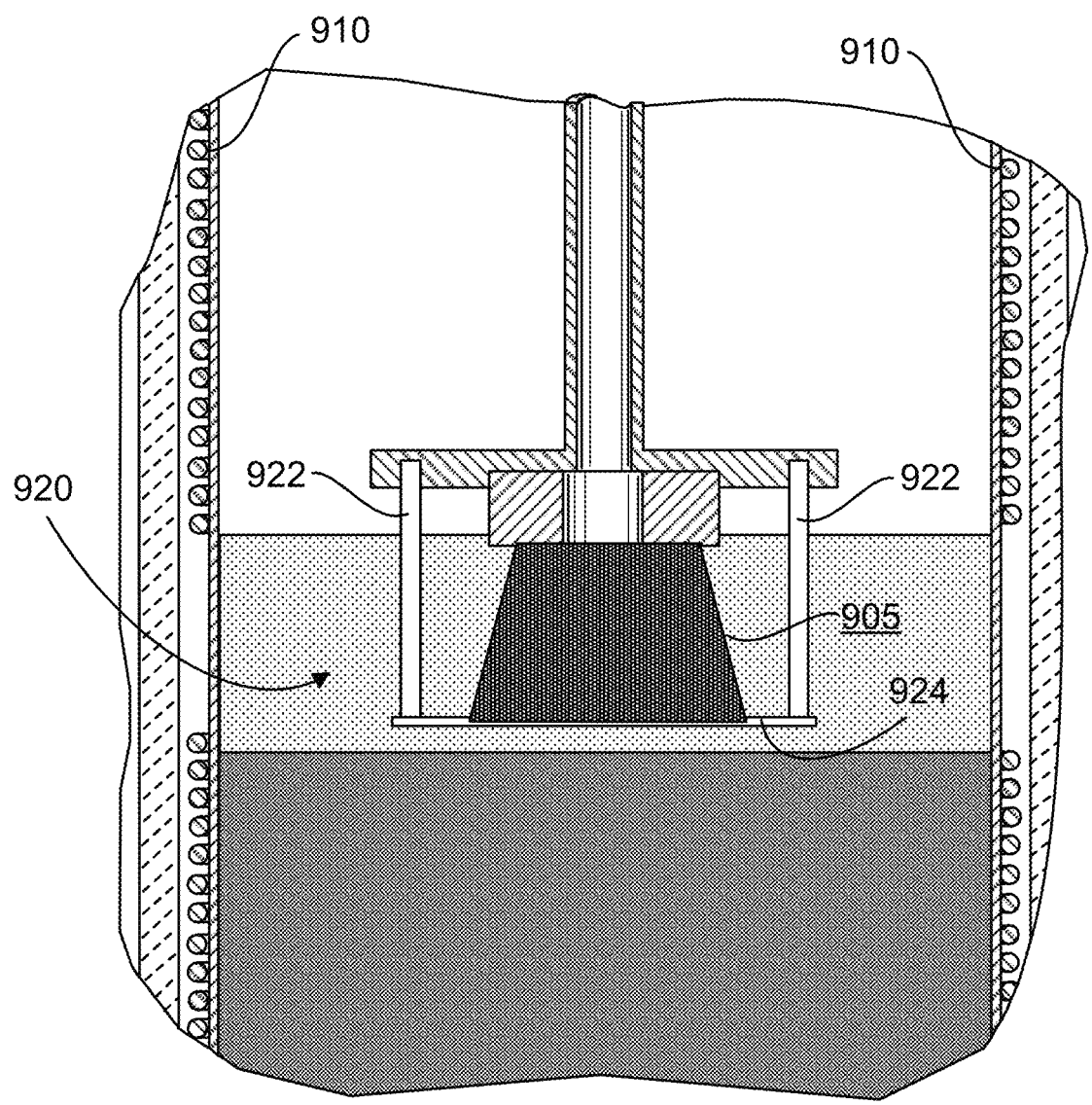
FIG. 9 is a simplified schematic diagram illustrating a lift mechanism according to an embodiment of the present invention.

FIG. 9 is a simplified schematic diagram illustrating a lift mechanism according to an embodiment of the present invention. In FIG. 9, elements of the crystal growth system are included, including sides 910 of the crucible. CdZnTe crystal 905 is positioned in encapsulating layer 912, for example boron oxide, and partially in contact with Te-rich Cd—Zn—Te melt 914. A lift mechanism 920 has been positioned to support the bottom of CdZnTe crystal 905. Lift mechanism 920 includes support arms 922 and support plate 924, which can be in contact with the bottom of CdZnTe crystal 905. Lift mechanism 920 can then be used to support the CdZnTe crystal as it is moved from Te-rich Cd—Zn—Te melt 914 to encapsulating layer 912. During growth, the Te-rich Cd—Zn—Te melt provides a buoyancy for the CdZnTe crystal. When the CdZnTe crystal is moved up into the encapsulating layer, because the buoyancy of the CdZnTe crystal is less in the encapsulating layer material, stresses at the interface between the seed crystal and the as-grown crystal can damage the CdZnTe crystal. The lift mechanism can thus be utilized to provide additional support for the CdZnTe crystal to supplement the support for the CdZnTe crystal provided by the buoyancy of the CdZnTe crystal in the encapsulating layer. In some embodiments, support arms 922 and support plate 924 are integrated as a single unit, for example, similar to a cage, that can be utilized to surround and support the CdZnTe crystal. The upward force provided by the lift mechanism 920 offsets the downward force from the weight of crystal and thereby offsets mechanical stresses at the interface between the seed crystal and the as-grown crystal and stresses at the mechanical connection between shaft 132 and CdZnTe crystal.

In some embodiments, lift mechanism 920 is integrated with one or more elements of heating element 750 discussed in relation to FIG. 7B. As an example, the heating element could be used in place of a support plate. In this example, after completing the crystal growth process, the heating element temperature could be reduced and the heating element could be raised to support the as-grown crystal, which can then be raised into the encapsulating layer. Although boron oxide is utilized for the encapsulating material in some embodiments of the present invention, this is not required by the present invention and other encapsulating materials are included within the scope of the present invention.

Figure 10:
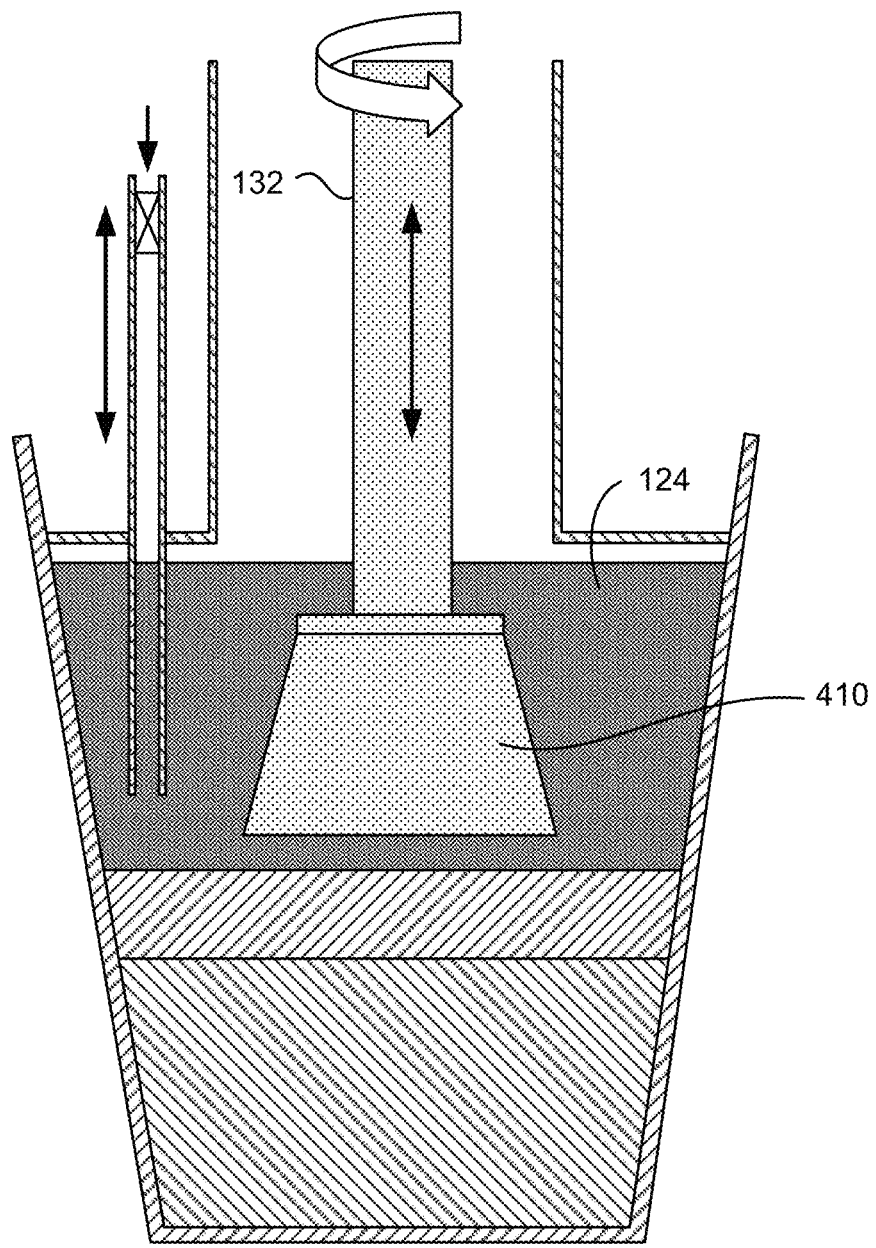
FIG. 10 is a simplified schematic diagram illustrating suspension of a CdZnTe crystal in an encapsulating layer during crystal cooling according to an embodiment of the present invention.

FIG. 10 is a simplified schematic diagram illustrating suspension of a CdZnTe crystal in an encapsulating layer during crystal cooling according to an embodiment of the present invention. After growth of the CdZnTe crystal, it is preferable to cool the as grown CdZnTe crystal in a controlled manner to prevent high thermal gradients if cooling were to be uncontrolled. As illustrated in FIG. 10, embodiments of the present invention enable cooling of the CdZnTe crystal inside the encapsulating layer 124 (e.g., boron oxide layer). Referring to FIG. 10, after growth has been completed, for example, achieving the desired crystal length, the CdZnTe crystal 410 is moved into the encapsulating layer 124, for example, by pulling up on shaft 132 until the CdZnTe crystal is suspended such that the CdZnTe seed crystal and the end (i.e., bottom) of the CdZnTe crystal are disposed in the encapsulating layer. The CdZnTe crystal can be cooled to a temperature near the solidification temperature of the material in the encapsulating layer and then removed from the encapsulating layer. As an example, using boron oxide as an encapsulating layer, the CdZnTe crystal, which is grown at a temperature in the range of 600° C. to 1050° C., for example, ~950° C., can be cooled in the boron oxide layer to a temperature of ~500-550° C., which is greater than the melting point of boron oxide, which is 450° C. Once the CdZnTe crystal reaches this intermediate temperature, it can be removed from the encapsulating layer, for example, by pulling up on shaft 132, and then cooled to a lower temperature, for example, room temperature.

Figure 11:
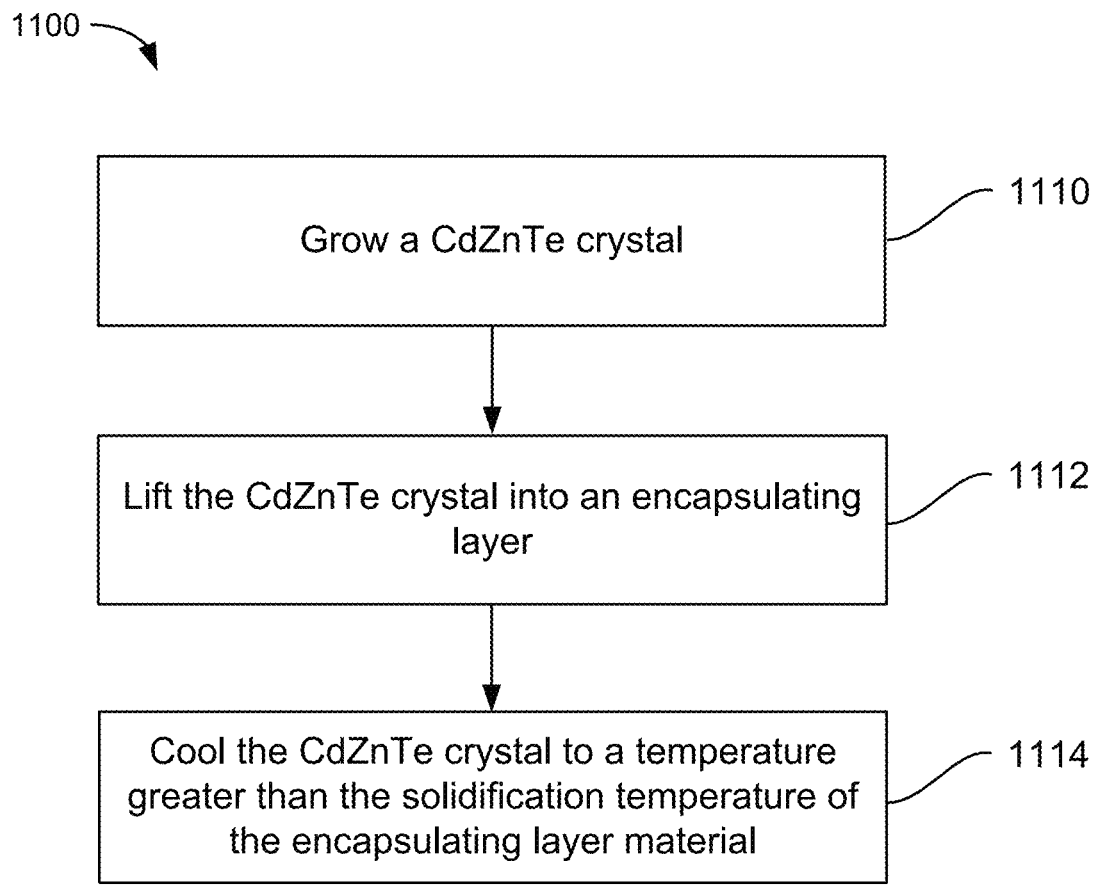
FIG. 11 is a simplified flowchart illustrating a method of cooling a CdZnTe crystal according to an embodiment of the present invention.

FIG. 11 is a simplified flowchart illustrating a method of cooling a CdZnTe crystal according to an embodiment of the present invention. The method 1100 includes growing a CdZnTe crystal from a Te-rich Cd—Zn—Te melt at least partially encapsulated by an encapsulating layer (1110) and lifting the CdZnTe crystal into the encapsulating layer (1112). The CdZnTe crystal can include a bulk single CdZnTe crystal. The Te-rich Cd—Zn—Te melt can be considered as an isothermal supersaturated solution. The methods of growing a CdZnTe crystal discussed in relation to FIG. 2 are applicable to the method discussed in relation to FIG. 11 as appropriate.

The method also includes cooling the CdZnTe crystal to a temperature greater than the solidification temperature of the material of the encapsulating layer (1114). In some embodiments, the method also includes supporting the CdZnTe crystal using a lift mechanism prior to lifting the CdZnTe crystal into the encapsulating layer. Before lifting the CdZnTe crystal into the encapsulating layer, the method can include supporting the CdZnTe crystal using a lift mechanism.

It should be appreciated that the specific steps illustrated in FIG. 11 provide a particular method of cooling a CdZnTe crystal according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A system for growing a CdZnTe crystal, the system comprising:
a crucible operable to contain a solid CdZnTe source;
a heating element operable to melt an upper surface to the solid CdZnTe source and form a tellurium rich melt floating on the solid CdZnTe source, wherein the crucible is operable to contain an encapsulating layer above the tellurium rich melt, wherein the heating element is movable within the crucible and within the tellurium rich melt floating on the solid CdZnTe source;
a rod operable to mechanically support a CdZnTe seed crystal;
a lift mechanism coupled to the rod and including support arms and a support plate disposed in the tellurium rich melt and in contact with the CdZnTe crystal, wherein the rod is operable to lift and rotate the support plate;
one or more vertical temperature shields positioned between sides of the crucible and the CdZnTe seed crystal; and
one or more horizontal temperature shields positioned above the encapsulating layer.

2. The system of claim 1 further comprising an injector operable to add zinc to the tellurium rich melt.

3. The system of claim 1 wherein the heating element comprises an annular heater.

4. The system of claim 1 further comprising a baffle partially disposed in the tellurium rich melt and surrounding the CdZnTe seed crystal.

5. The system of claim 1 further comprising a control system coupled to the heating element.

6. The system of claim 1 further comprising:
a first motor mechanically coupled to the crucible;
a second motor mechanically coupled to the heating element;
a third motor mechanically coupled to the rod, wherein the third motor is operable to rotate and translate the rod; and
a control system coupled to the first motor, the second motor, and the third motor.

7. The system of claim 1 wherein the crucible is an open crucible.

8. The system of claim 1 wherein the tellurium rich melt comprises an isothermal supersaturated solution.

9. The system of claim 1 further comprising a seed crystal heater that introduces heat into the CdZnTe seed crystal and the rod.

10. The system of claim 1 wherein the support plate is in contact with a bottom surface of the CdZnTe crystal.

11. The system of claim 1 further comprising an external heater external to the crucible.

12. The system of claim 1 wherein the one or more horizontal temperatures shields join the one or more vertical temperature shields to the sides of the crucible.

13. The system of claim 1 wherein the one or more horizontal temperatures shields are perpendicular to the one or more vertical temperature shields.

14. The system of claim 2 wherein the injector extends through the one or more horizontal temperatures shields.

15. The system of claim 4, wherein the baffle partially is disposed in the tellurium rich melt.

16. The system of claim 4, wherein the one or more vertical temperature shields are positioned between the sides of the crucible and the baffle.

17. The system of claim 4 wherein the baffle comprises a grid of spaces through a solid plate.

18. The system of claim 4 wherein the baffle is tapered such that a lateral dimension of the baffle increases toward the one or more horizontal temperatures shields.

* * * * *